(12) United States Patent
Nakaji et al.

(10) Patent No.: US 7,557,418 B2
(45) Date of Patent: Jul. 7, 2009

(54) SEMICONDUCTOR PHOTORECEPTOR DEVICE

(75) Inventors: Masaharu Nakaji, Tokyo (JP); Eitaro Ishimura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 440 days.

(21) Appl. No.: 11/133,338

(22) Filed: May 20, 2005

(65) Prior Publication Data

US 2006/0043518 A1 Mar. 2, 2006

(30) Foreign Application Priority Data

Aug. 25, 2004 (JP) ............... 2004-244823

(51) Int. Cl.
*H01L 31/058* (2006.01)
(52) U.S. Cl. ............... 257/432; 257/431; 257/461; 257/466; 257/E31.001
(58) Field of Classification Search ............... 257/431, 257/432, 448, 461, 466
See application file for complete search history.

(56) References Cited

U.S. PATENT DOCUMENTS 5,825,047 A * 10/1998 Ajisawa et al. ............... 257/12
2004/0075154 A1 4/2004 Nakaji et al.

FOREIGN PATENT DOCUMENTS

| JP | 2002-217446 | 8/2002 |
|----|-------------|--------|
| JP | 2004-146408 | 5/2004 |
| JP | 2004-152942 | 5/2004 |
| JP | 2004-165529 | 6/2004 |

OTHER PUBLICATIONS

T. Aoyagi et al., "40 Gbps Waveguide Photodiode for Flip-Chip Assembly", OFC' 97 vol. 6, p. 37, Tu13, (1997).

* cited by examiner

*Primary Examiner*—Jack Chen
*Assistant Examiner*—Matthew Reames
(74) *Attorney, Agent, or Firm*—Leydig, Voit & Mayer, Ltd.

(57) ABSTRACT

A semiconductor light detecting device includes an n-contact layer selectively disposed on an Fe—InP substrate. An optical waveguide layer is disposed on the n-contact layer and includes an n-cladding layer, a light absorption layer, and a p-cladding layer, laminated on one another, over the n-contact layer, in that order. An Fe—InP current blocking layer is disposed on the n-cladding layer such that sides of the optical waveguide layer are buried in the Fe—InP current blocking layer. A p-electrode includes a contact electrode electrically connected to the p-cladding layer of the optical waveguide layer, a lead-out electrode portion extending on a side wall of the current blocking layer from the contact electrode and extending on the Fe—InP substrate, and an electrode pad disposed on a surface of the Fe—InP substrate, with an SiN film between the electrode pad and the surface of the Fe—InP substrate and connected to the lead-out electrode portion.

2 Claims, 6 Drawing Sheets

SEMICONDUCTOR PHOTORECEPTOR DEVICE

BACKGROUND OF THE INVENTION

1. Field of the Invention

The present invention relates to a semiconductor photoreceptor device and a manufacturing method therefor, and more particularly to a semiconductor photoreceptor device used for optical communications systems, etc. and a manufacturing method therefor.

2. Background Art

The capacity of communications systems has been increased to satisfy the dramatically increasing demand for communications. Accordingly, there has been a need for higher-speed, higher-efficiency yet lower-cost and smaller optical communications devices.

In transmission systems for optical communications, efforts are being made to develop and improve high-speed optical communications devices to accommodate 40-GHz band signal light.

One factor in determining the response speed of semiconductor photoreceptor devices such as PIN photodiodes and avalanche photodiodes is their CR time constant. (The term "photodiode" is hereinafter abbreviated as "PD".) The CR time constant of a semiconductor photoreceptor device is determined by its device capacitance and device resistance. Therefore, increasing the response speed of the semiconductor photoreceptor device requires reducing the CR time constant. Various techniques have been used to reduce the CR time constant of semiconductor photoreceptor devices for super-high-speed communications (the 40 GHz band or higher).

For example, the diameter of the light receiving portion of semiconductor photoreceptor devices has been reduced to reduce the capacitance. Further, the device capacitance of other portions has also been reduced. One method for reducing the pad capacitance of the electrode pad portion is to deposit a thick insulating film of $SiO_2$ or SiN under it.

To reduce the pad capacitance to negligible levels, one known technique provides a semiconductor photoreceptor device configured such that a waveguide type absorption layer structure is formed on a semi-insulative InP substrate and buried in semi-insulative InP so as to provide a flat surface, allowing the surfaces of the anode and the cathode electrodes to have substantially the same height. This enables the flip-chip mounting of the semiconductor photoreceptor device. See, for example, "40 Gbps Waveguide Photodiode for Flip-Chip Assembly", Extended Abstracts of The 49th Spring Meeting of The Japan Society of Applied Physics and Related Societies (held at Shonan School of Tokai University in Mar. 2002), p. 1152, 27a-ZG-7.

Another known technique provides a semiconductor photoreceptor device configured such that: it has a buried waveguide type absorption layer structure employing a semi-insulative semiconductor substrate; and Be, Mg, or C is used as a p-type impurity to reduce the diffusion of Zn into the light absorption layer and the blocking layer. See, for example, Japanese Laid-Open Patent Publication No. 2004-146408 (paragraph [0006] and FIGS. 1 to 3).

Still another known technique provides a configuration in which: a semiconductor photoreceptor device is formed on a semi-insulative InP substrate; the n-type electrode is formed on the back side of the semi-insulative InP substrate; the p-side bonding pad is formed on the semi-insulative InP substrate with a silicon nitride antireflective film in between; and the wiring from the p-side electrode to the p-side bonding pad is formed on an n-type layer with the silicon nitride antireflective film in between. See, for example, Japanese Patent Laid-Open No. 2004-152942 (paragraphs [0028] to [0034] and FIGS. 1, 4, and 5).

Yet another known technique provides a configuration in which: a semi-insulative substrate is formed to have a protrusion; a photoreceptor device is formed around or adjacent the protrusion; and the electrode pad connected to the p-electrode of the photoreceptor device is formed on the protrusion, which is located at substantially the same height as the p-electrode. See, for example, Japanese Laid-Open Patent Publication No. 2004-165529 (paragraphs [0063] to [0068] and FIGS. 7 and 6).

Still a further known technique etches an InP substrate laminated over a semi-insulative InP substrate whose principal surface is a (100) plane by use of HBr solution so as to produce a (111)A plane. See, for example, Japanese Patent Laid-Open No. 2002-217446 (paragraphs [0015] to [0019] and FIG. 7).

As described above, a conventional semiconductor photoreceptor device is configured such that a waveguide type absorption layer structure is formed on a semi-insulative InP substrate and buried in semi-insulative InP, which enables the flip-chip mounting of the semiconductor photoreceptor device and thereby reduces the pad capacitance. However, since the semi-insulative InP burying layer is formed on the semi-insulative InP substrate using a regrowth technique, a silicon layer may be undesirably formed at the regrowth interface between the semi-insulative InP substrate and the semi-insulative burying layer depending on the material and the regrowth conditions. (This lamination layer is hereinafter referred to as an Si pile-up layer.)

For example, SIMS analysis was conducted on the growth interface between a semi-insulative Fe-doped InP substrate and an Fe-doped InP layer grown on the substrate. ("Fe-doped InP" is hereinafter abbreviated to as "Fe—InP".) The amount of Si detected in an interface portion approximately 0.5 µm thick was $1\times10^{18}$ atoms/cc (peak value).

This approximately 0.5 µm thick layer is considered to be an Si pile-up layer. Since this Si pile-up layer is connected with the n-type layer of the semiconductor photoreceptor device, it becomes a conductive layer, forming pad capacitance (a capacitance due to a pad) between the Si pile-up layer and the electrode pad portion for the p-electrode and the lead-out electrode portion for connecting the electrode pad portion and the p-electrode.

It has been found that if such a pad capacitance is present, the high-frequency response of the semiconductor photoreceptor device degrades more severely with increasing electrode pad area. Furthermore, the response of the semiconductor photoreceptor device also degrades at low frequencies around 10 GHz.

The pad capacitance due to the Si pile-up layer does not affect signal light having relatively low frequencies (up to 40 GHz) very much. With signal light having frequencies higher than 40 GHz, however, the response degrades 1 dB at frequencies in the neighborhood of 10 GHz. Such degradation of the response in this frequency region may lead to an unfavorable eye pattern. (The eye pattern can be used as an indicator when evaluating the high frequency characteristics of a semiconductor photoreceptor device.)

Thus, the pad capacitance degrades the high frequency characteristics of the semiconductor photoreceptor device and thereby prevents a favorable eye pattern from being formed, resulting in a reduction in the yield of the semiconductor photoreceptor device.

To prevent degradation of the high frequency characteristics due to the Si pile-up layer, a groove reaching the Fe—InP substrate may be formed under the lead-out electrode portion such that the lead-out electrode portion connects between the p-electrode and the electrode pad portion in an air bridging manner, thereby reducing the pad capacitance.

This configuration, however, requires a complicated manufacturing process since the lead-out electrode-portion must be suspended in air, making it difficult to produce the semiconductor photoreceptor device. Furthermore, this configuration suffers from lack of reliability since the air-bridge-like lead-out electrode portion might break.

SUMMARY OF THE INVENTION

The present invention has been devised to solve the above problems. It is, therefore, a first object of the present invention to provide a semiconductor photoreceptor device which has a simple configuration and hence achieves high yield and which exhibits good high frequency characteristics. A second object of the present invention is to provide a simple method for manufacturing a semiconductor photoreceptor device having good high frequency characteristics with high yield.

According to one aspect of the present invention, a semiconductor photoreceptor device comprises a semi-insulative semiconductor substrate, a first semiconductor layer of a first conductive type disposed on the semiconductor substrate and having a first electrode disposed thereon, an optical waveguide layer disposed on the first semiconductor layer and including a first cladding layer of the first conductive type, a light absorption layer, and a second cladding layer of a second conductive type which are laminated onto one another over the first semiconductor layer in that order, a semi-insulative semiconductor burying layer disposed on the first cladding layer such that sides of the optical waveguide layer are buried in the semi-insulative semiconductor burying layer, and a second electrode including an electrode portion disposed on the second cladding layer of the optical waveguide layer, a lead-out portion extending on a side wall of the burying layer from the electrode portion and further extending on the semiconductor substrate, and an electrode pad disposed on a surface of the semiconductor substrate with an insulating film in between and connected with the lead-out portion.

According to another aspect of the present invention, a semiconductor photoreceptor device comprises a semi-insulative semiconductor substrate, a first electrode disposed on the semiconductor substrate, an optical waveguide layer disposed on the semiconductor substrate and including a first cladding layer of a first conductive type, a light absorption layer, and a second cladding layer of a second conductive type which are laminated onto one another over the semiconductor substrate in that order, the first cladding layer being connected with the first electrode, a p-type impurity semiconductor layer disposed on the semiconductor substrate such that the p-type impurity semiconductor layer is close to the portion of the semiconductor substrate surrounding the optical waveguide layer, the p-type impurity semiconductor layer containing a predetermined concentration of a p-type impurity, a semi-insulative semiconductor burying layer disposed on the semiconductor substrate with the p-type impurity semiconductor layer in between such that sides of the optical waveguide layer are buried in the semi-insulative semiconductor burying layer, and a second electrode including an electrode portion disposed on the second cladding layer of the optical waveguide layer, and a lead-out portion and an electrode pad both disposed on an insulating film formed on a surface of the burying layer, the lead-out portion and the electrode pad being connected with the electrode portion and facing the p-type impurity semiconductor layer.

Other and further objects, features and advantages of the invention will appear more fully from the following description.

DETAILED DESCRIPTION OF THE PREFERRED EMBODIMENTS

Preferred embodiments of the present invention will be described below as applied to a 40 Gbps buried waveguide type PIN-PD, which is a semiconductor photoreceptor device used for optical communications systems.

First Embodiment

Figure 1:
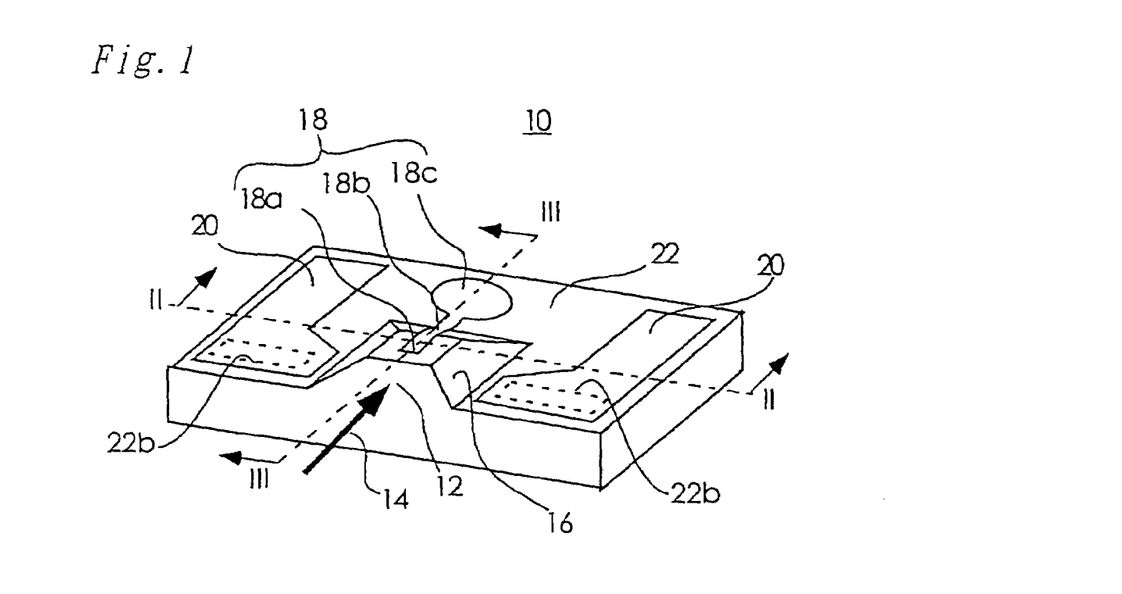
FIG. 1 is a perspective view of a semiconductor photoreceptor device according to a first embodiment of the present invention.
Figure 2:
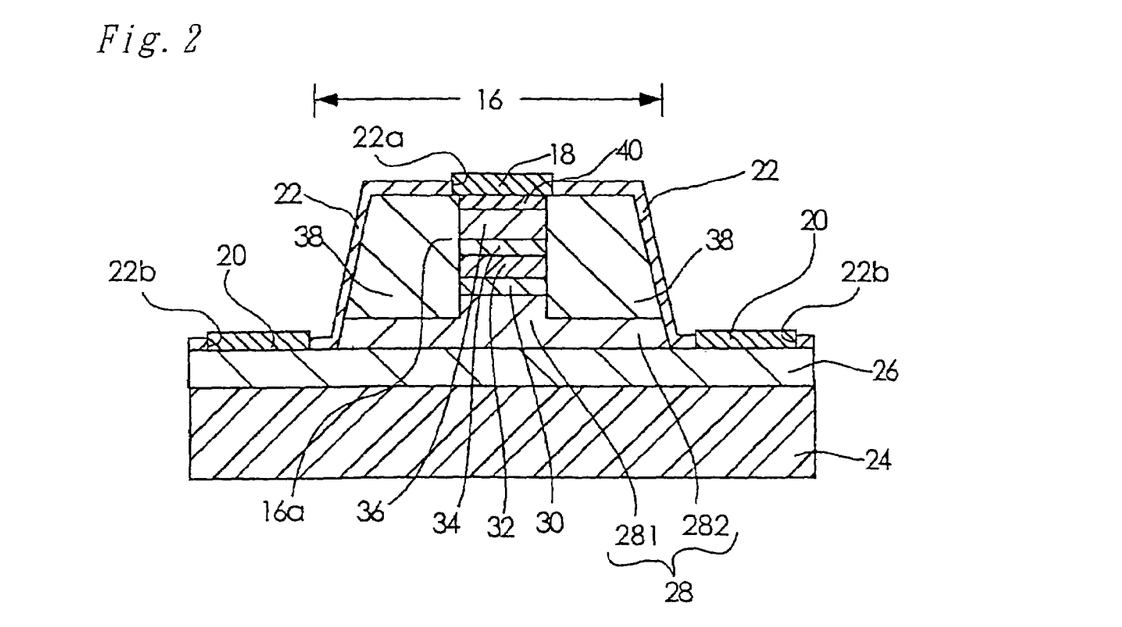
FIG. 2 is a cross-sectional view of the semiconductor photoreceptor device shown in FIG. 1 taken along line II-II of FIG. 1.
Figure 3:
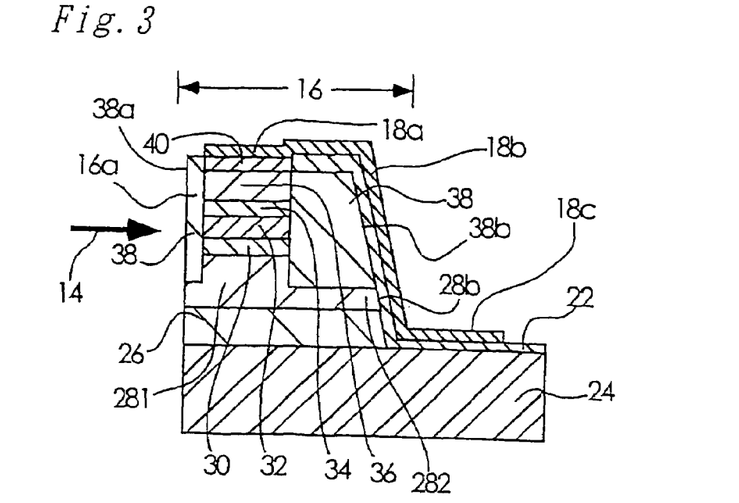
FIG. 3 is a cross-sectional view of the same semiconductor photoreceptor device taken along line III-III of FIG. 1.

FIG. 1 is a perspective view of a semiconductor photoreceptor device according to a first embodiment of the present invention. FIG. 2 is a cross-sectional view of the semiconductor photoreceptor device shown in FIG. 1 taken along line II-II, while FIG. 3 is a cross-sectional view of the same semiconductor photoreceptor device taken along line III-III. It should be noted that like numerals will be used to denote the same or corresponding components.

Referring to FIG. 1, a light receiving portion 12 in the front of this buried waveguide type PIN-PD 10 receives signal light 14 indicated by the arrow. A waveguide mesa 16 is formed such that it projects from the top surface of the PIN-PD 10. The waveguide mesa 16 includes a waveguide 16a to which the signal light is introduced through the light receiving portion 12, as shown in FIGS. 2 and 3. A p-electrode 18 (acting as a second electrode) is disposed along the top surface of the waveguide mesa 16 such that the p-electrode 18 extends toward the rear side of the light receiving portion 12.

The p-electrode 18 is composed of: a contact electrode 18a; a lead-out electrode portion 18b connected to the contact electrode 18a; and an electrode pad 18c connected to the lead-out electrode portion 18b. Further, n-electrodes 20 are disposed on both sides of the waveguide mesa 16 formed on the top surface of the PIN-PD 10. An insulating film (e.g., an SiN film 22) covers the top surface of the PIN-PD 10 other than an opening 22a (shown in FIG. 2) and openings 22b. The p-electrode 18 is connected to the waveguide 16a through the opening 22a, and the n-electrodes 20 are electrically connected through the openings 22b.

FIG. 2 is a cross-sectional view taken in a direction perpendicular to the traveling direction of the signal light, or perpendicular to the (light wave) direction of the waveguide 16.

Referring to FIG. 2, an n-conductive type InGaAs (acting as a first semiconductor layer) is disposed on a semi-insulative Fe—InP substrate 24 (acting as a semi-insulative semiconductor substrate). ("n-conductive type", "p-conductive type", and "intrinsic semiconductor" are hereinafter abbreviated as "n-", "p-", and "i-", respectively.) The principal surface of the Fe—InP substrate 24 is, for example, a (100) plane.

Over the surface of the n-contact layer 26 are disposed an n-InP cladding layer 28 (acting as a first cladding layer), an n-InGaAsP light confining layer 30, an i-InGaAs light absorption layer 32, a p-InGaAsP light confining layer 34, a p-InP cladding layer 36 (acting as a second cladding layer), and a p-InGaAs contact layer 40 which are sequentially formed in that order. Specifically, these layers are formed such that: the n-cladding layer 28 includes a central portion 281 having a predetermined thickness and a peripheral portion 282, the central portion 281 being thicker than the peripheral portion 282; the n-light confining layer 30 is disposed on the surface of the central portion 281 of the n-cladding layer 28; the light absorption layer 32 is disposed on the surface of the n-light confining layer 30; the p-light confining layer 34 is disposed on the surface of the light absorption layer 32; the p-cladding layer 36 is disposed on the surface of the p-light confining layer 34; and the p-contact layer 40 is disposed on the surface of the p-cladding layer 36.

The waveguide mesa 16 comprises: the waveguide 16a (acting as an optical waveguide layer) including the central portion 281 of the n-cladding layer 28, the n-light confining layer 30, the light absorption layer 32, the p-light confining layer 34, the p-cladding layer 36, and the p-contact layer 40; and an Fe—InP blocking layer 38 (acting as a burying layer) disposed on the peripheral portion 282 of the n-cladding layer 28 and burying the sides of the waveguide 16a.

The SiN film 22 disposed on the waveguide mesa 16 and on the n-contact layer 26 has the opening 22a over the p-contact layer 40. The contact electrode 18a of the p-electrode 18 is electrically connected to the p-contact layer 40 through the opening 22a. Furthermore, the SiN film 22 also has the openings 22b over both side portions (formed of the n-contact layer 26) of the waveguide mesa 16. The n-electrodes 20 are electrically connected to the n-contact layer 26 through the openings 22b.

FIG. 3 is a cross-sectional view taken in the traveling direction of the signal light, or in the length direction of the waveguide. According to the present embodiment, the principal surface of the Fe—InP substrate 24 is, for example, a (100) plane, and the traveling direction of the signal light (or the length direction of the waveguide) is a [011] direction.

In FIG. 3, the arrow indicates the traveling direction of the signal light 14.

Let the light receiving side end face 38a of the waveguide mesa 16 be designated as the front. As shown in the figure, the portion of the n-contact layer 26 on the rear side of the waveguide mesa 16 has been removed to expose the Fe—InP substrate 24 thereunder. The exposed portion of the Fe—InP substrate 24 is covered by the SiN film 22.

In front and back of the waveguide 16a, the blocking layer 38 including the light receiving side end face 38a is disposed on the peripheral portion 282 of the n-cladding layer 28.

That is, the sides of the waveguide 16a are buried in the blocking layer 38, and signal light is introduced into the waveguide 16a through the light receiving portion 12 of the light receiving side end face 38a of the blocking layer 38.

For example, the principal surface of the Fe—InP substrate 24 is a (100) plane and the traveling direction of the signal light is a [011] direction. Therefore, according to the present embodiment, the rear side wall surface 38b of the blocking layer 38 and the rear side wall surface 28b of the peripheral portion 282 of the n-cladding layer 28 behind the waveguide 16a (that is, the crystal surfaces of the side walls of the blocking layer 38 and the peripheral portion 282 of the n-cladding layer 28 that cross the traveling signal light 14) are (111) planes.

The p-electrode 18 is made up of: the contact electrode 18a disposed on the p-contact layer 40 of the waveguide 16a through the opening 22a; the lead-out electrode portion 18b connected with the contact electrode 18a and disposed on the SiN film 22 such that it extends along the top surface and the rear side wall surface 38b of the blocking layer 38 and along the rear side wall surface 28b of the peripheral portion 282 of the n-cladding layer 28; and the electrode pad 18c connected with the lead-out electrode portion 18b and disposed on the SiN film 22 on the surface of the Fe—InP substrate 24 behind the waveguide mesa 16.

Thus, the lead-out electrode portion 18b runs along the rear side wall surface 38b of the blocking layer 38 and along the rear side wall surface 28b of the peripheral portion 282 of the n-cladding layer 28. These wall surfaces are (111) planes. This means that even though there is a height difference between the contact electrode 18a formed on the p-contact layer 40 of the waveguide 16a and the electrode pad 18c formed on the surface of the Fe—InP substrate 24 with the SiN film 22 in between, the lead-out electrode portion 18b having a gradual slope connects between them (that is, the p-electrode 18 extends while gradually descending). This arrangement prevents the p-electrode 18 from being broken due to a sudden drop in height, thereby enhancing the reliability of the PIN-PD 10.

In the PIN-PD 10 of the first embodiment, the electrode pad 18c of the p-electrode 18 is disposed on the surface of the Fe—InP substrate 24 with the SiN film 22 in between, whereas the n-electrodes are disposed on the n-contact layer 26 with the SiN film 22 in between. This means that the electrode pad 18c and the n-electrodes differ from each other in height by the thickness of the n-contact layer 26. However, they can be regarded as being at substantially the same height, enabling the flip-chip mounting of the PIN-PD 10.

It should be noted that the n-type impurity in each layer is a Group IV element, for example, Si or S. The present embodiment uses S as the n-type impurity. The p-type impurity, on the other hand, is a Group II element, for example, Be or Zn. The present embodiment uses Be as the p-type impurity. No impurities are added in the light absorption layer 32, which is an intrinsic semiconductor layer.

The n-contact layer 26 has an impurity concentration of $5 \times 10^{18}$ cm$^{-3}$; the n-cladding layer 28, $5 \times 10^{17}$ cm$^{-3}$; the n-light confining layer 30, $5 \times 10^{17}$ cm$^{-3}$; the p-light confining layer 34, $5 \times 10^{15}$ cm$^{-3}$ to $5 \times 10^{17}$ cm$^{-3}$ (changed stepwise); the p-cladding layer 36, $1 \times 10^{18}$ cm$^{-3}$; and the p-contact layer 40, $1 \times 10^{19}$ cm$^{-3}$.

Thus, the p-light confining layer 34, the n-light confining layer 30, and the light absorption layer 32 sandwiched by the light confining layers 34 and 30 constitute a p/i/n junction.

A brief description will be given below of a method for manufacturing the PIN-PD 10 according to the present embodiment.

FIGS. 4 to 7 and 9 are perspective views illustrating each step of the method for manufacturing a semiconductor photoreceptor device according to the present embodiment.

Figure 7:
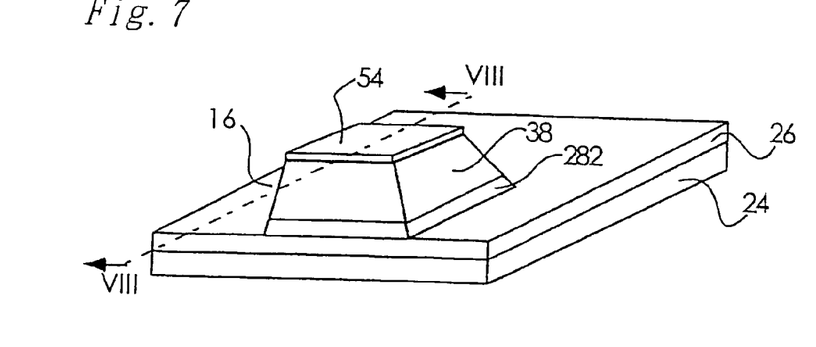
Figure 8:
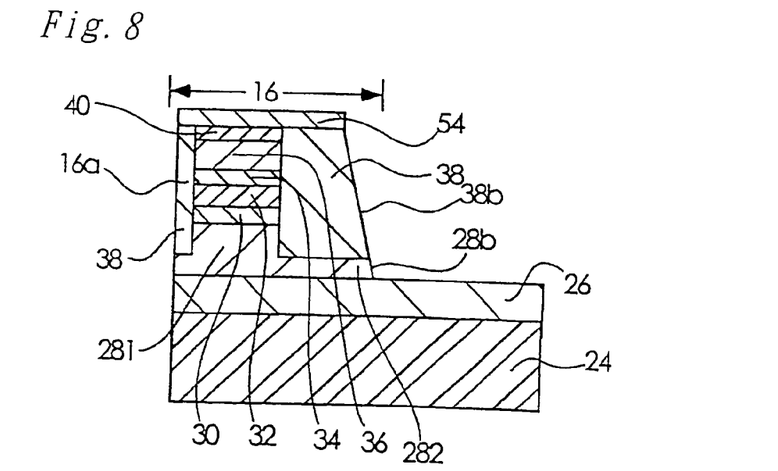
FIG. 8 is a cross-sectional view of the semiconductor photoreceptor device shown in FIG. 7 taken along line VIII-VIII of FIG. 7.

FIG. 8 is a cross-sectional view of the semiconductor photoreceptor device shown in FIG. 7 taken along line VIII-VIII.

Over the semi-insulative Fe—InP substrate 24 whose principal surface is, for example, a (100) plane, are disposed an n-InGaAs layer (corresponding to the n-contact layer 26), an n-InP layer (the n-cladding layer 28), an n-InGaAsP layer (the n-light confining layer 30), an i-InGaAs layer (the light absorption layer 32), a p-InGaAsP layer (the p-light confining layer 34), a p-InP layer (the p-cladding layer 36), and a p-InGaAs layer (the p-contact layer 40) which are laminated onto one another in that order by, for example, the metalorganic (chemical) vapor deposition method.

Then, an $SiO_2$ film is formed on the surface (the entire wafer surface) of the p-InGaAs layer (corresponding to the p-contact layer 40) as a first insulating film, and a photoresist mask is formed on the $SiO_2$ film. Using the photoresist mask, the $SiO_2$ film is processed by dry etching to form a rectangular $SiO_2$ film 50 as an island-shaped first insulating film. The rectangular $SiO_2$ film 50 has a side running in a [011] direction. It should be noted that the shape of the rectangular $SiO_2$ film 50 is formed such that the [011] direction coincides with the light traveling direction.

Figure 4:
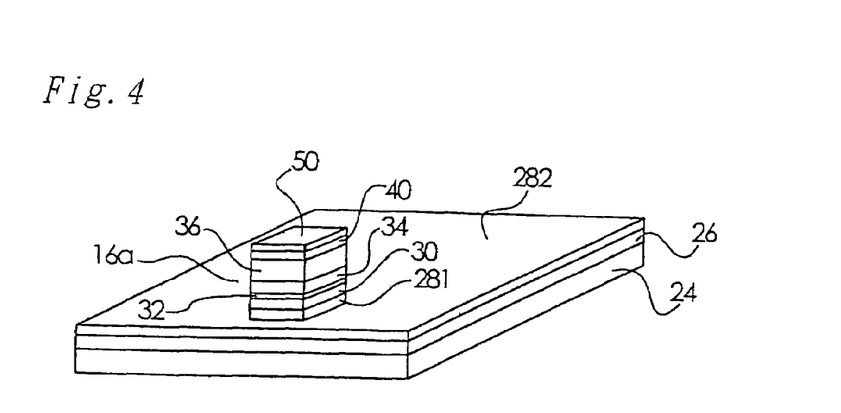
FIGS. 4 to 7 and 9 are perspective views illustrating each step of the method for manufacturing a semiconductor photoreceptor device according to the present embodiment.

After removing the photoresist mask, each layer is etched using the rectangular $SiO_2$ film 50 as a mask until the n-InP layer (the n-cladding layer 28) is etched to a predetermined depth, for example, half the original depth to form the waveguide 16a, as shown in FIG. 4.

Figure 5:
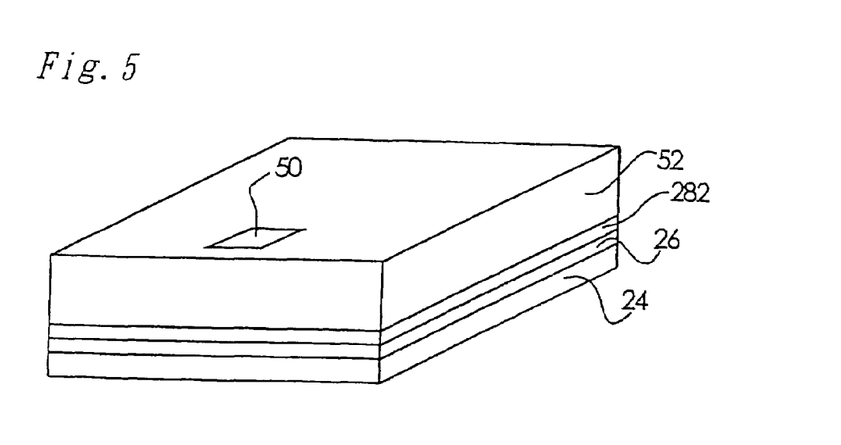

Then, after pretreating the surface, Fe—InP is selectively grown by, for example, the metalorganic (chemical) vapor deposition method using the rectangular $SiO_2$ film 50 as a selective growth mask such that the waveguide 16a is buried in an Fe—InP layer 52 (acting as a burying layer), as shown in FIG. 5.

The above step causes an Si pile-up layer to be formed at the interface (the regrowth interface) between the peripheral portion 282 of the n-InP layer (the n-cladding layer 28) and the Fe—InP layer 52.

Figure 6:
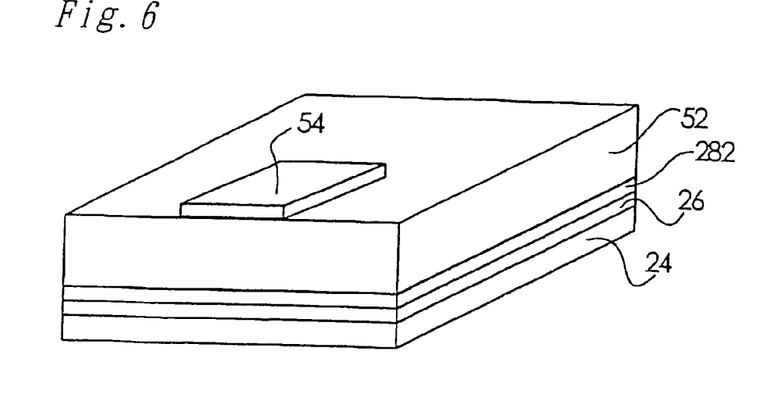

Then, after completely removing the rectangular $SiO_2$ film 50, an SiN film is formed on the surfaces of the waveguide 16a and the Fe—InP layer 52 as a second insulating film, and a photoresist mask is formed on the SiN film. Using the photoresist mask, the SiN film is processed by dry etching to form a rectangular SiN film 54 as an island-shaped second insulating film, as shown in FIG. 6. The rectangular SiN film 54 is formed on the surface of the region including the waveguide 16a and the portion of the Fe—InP layer 52 surrounding the waveguide 16a, and has a side running in a [011] direction.

Then, the wafer is etched by hydrochloric acid, a mixed solution of hydrochloric acid and phosphoric acid, or hydrochloric acid diluted with water using the rectangular SiN film 54 as a mask until the n-InGaAs layer (the n-contact layer 26) is exposed, forming the waveguide mesa 16. (These 3 types of etchants are hereinafter referred to as "hydrochloric acid etchants".)

Hydrochloric acid etchants can etch InP and InGaAsP but can hardly etch InGaAs. Therefore, the etching proceeds through the Fe—InP layer 52 and the n-InP layer (the n-cladding layer 28) and then stops when the n-InGaAs layer (the n-contact layer 26) has been exposed, as shown in FIGS. 7 and 8.

Further, hydrochloric acid etchants exhibit anisotropy in etching InP or InGaAsP.

Since the rectangular SiN film 54 has a side in [011] direction, the rear side wall surface 38b of the Fe—InP layer (the blocking layer 38) and the rear side wall surface 28b of the peripheral portion 282 of the n-InP layer (the n-cladding layer 28) behind the waveguide 16a are the crystal surfaces of the rear side walls that cross the traveling signal light 14. According to the present embodiment, these crystal surfaces are, for example, (111) planes.

Figure 9:
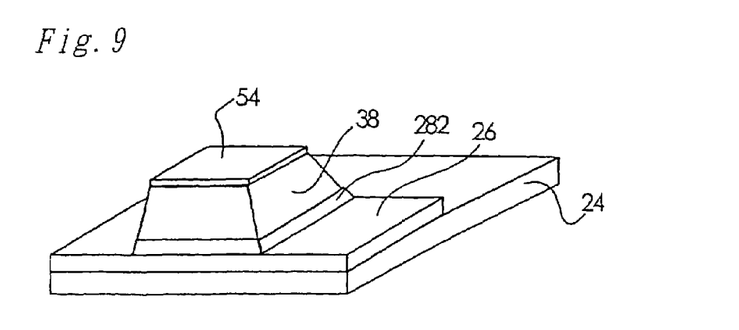

Then, a photoresist is formed on the surfaces of the waveguide mesa 16 and the n-contact layer 26. After that, portions of the photoresist other than those on the waveguide mesa 16 and on the n-contact layer 26 on both sides of the waveguide mesa 16 are removed, forming a photomask. Then, the portion of the n-contact layer 26 behind the waveguide mesa 16 is removed by dry etching using this photomask, exposing the Fe—InP substrate 24, as shown in FIG. 9.

Then, after removing the photomask, an SiN film is formed on the surfaces of the waveguide mesa 16, the n-contact layer 26 on both sides of the waveguide mesa 16, and the Fe—InP substrate 24 as a third insulating film. Furthermore, the opening 22a is formed in the SiN film so as to expose the p-contact layer 40 at the top of the waveguide mesa 16, and the openings 22b are also formed in the SiN film so as to expose the portions of the n-contact layer 26 on both sides of the waveguide mesa 16.

After that, EB evaporation is carried out using a photoresist as a lift-off mask and then a lift-off etching process is performed to form the p-electrode 18 and the n-electrodes 20, the p-electrode 18 comprising the contact electrode 18a, the lead-out electrode portion 18b connected to the contact electrode 18a, and the electrode pad 18c connected to the lead-out electrode 18b.

Thus, even though there is a height difference between the contact electrode 18a formed on the p-contact layer 40 of the waveguide 16a and the electrode pad 18c formed on the surface of the Fe—InP substrate 24, they are connected by the lead-out electrode portion 18b which runs along the rear side wall surface 38b of the Fe—InP layer and the rear side wall surface 28b of the peripheral portion 282 of the n-cladding layer 28 each having a gradual slope. (These wall surfaces are (111) planes.) This arrangement prevents the p-electrode 18 from being broken due to a sudden drop in height, thereby enhancing the reliability of the PIN-PD 10.

The operation of the PIN-PD 10 will be described below.

Light enters the light absorption layer 32 through the light receiving portion 12 in the front of the PIN-PD 10. The waveguide 16a confines the light by utilizing the refractive index differences between the materials of its component layers such as: the light absorption layer 32; the n-light confining layer 30 and the p-light confining layer 34 sandwiching the light absorption layer 32; and the n-cladding layer 28 and the p-cladding layer 36 adjacent to the n-light confining layer 30 and the p-light confining layer 34, respectively. The light confined within the waveguide 16a is absorbed and converted into an electrical signal while it is propagated through the light absorption layer 32, the n-light confining layer 30, and the p-light confining layer 34.

The blocking layer 38 surrounding the waveguide 16a has a reduced refractive index to increase the refractive index difference between the blocking layer 38 and the waveguide 16a. This arrangement enhances the light confinement efficiency, thereby increasing the light reception sensitivity of the photoreceptor device.

According to the above manufacturing process for the PIN-PD 10, since the regrowth interface is the interface between the peripheral portion 282 of the n-InP layer (the n-cladding layer 28) and the Fe—InP layer selectively grown on the peripheral portion 282, the PIN-PD 10 has an Si pile-up layer at the interface between the peripheral portion 282 of the n-cladding layer 28 and the blocking layer 38 (the Fe—InP layer) within the waveguide mesa 16.

The p-electrode 18 is made up of: the contact electrode 18a in contact with the p-contact layer 40; the lead-out electrode portion 18b disposed on the top surface and the rear side wall surface 38b of the blocking layer 38 and on the rear side wall surface 28b of the peripheral portion 282 of the n-cladding layer 28 with the SiN film 22 in between; and the electrode pad 18c disposed on the surface of the Fe—InP substrate 24 with the SiN film 22 in between behind the waveguide mesa 16. Therefore, the electrode pad 18c has no pad capacitance with the Si pile-up layer.

Figure 10:
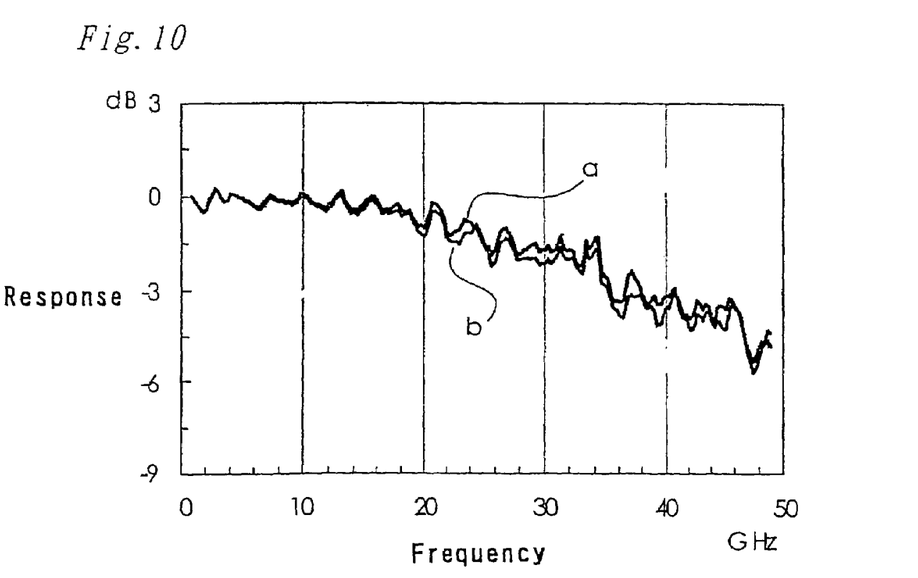
FIG. 10 is a graph showing measured high frequency characteristics of semiconductor photoreceptor devices according to the first embodiment of the present invention.

FIG. 10 is a graph showing measured high frequency characteristics of semiconductor photoreceptor devices according to the first embodiment of the present invention.

In FIG. 10, the horizontal axis represents the frequency in GHz, while the vertical axis represents the response in dB. Referring to the figure, the area of the electrode pad 18c was set to a smaller value when the response characteristic curve a was obtained than when the response characteristic curve b was obtained.

In the case of the PIN-PD 10, as shown in the figure, there is no significant difference between the two response characteristic curves a and b. This indicates that the high frequency characteristics vary little depending on the area of the electrode pad 18c; that is, the electrode pad 18c is considered to have little pad capacitance.

Therefore, the entire p-electrode 18 has reduced pad capacitance, making it possible to provide a semiconductor photoreceptor device having good high frequency characteristics.

Further, the PIN-PD 10 has frequency characteristics in which the frequency response is flat at up to approximately 15 GHz, exhibiting no reduction in the response at low frequencies.

Therefore, the PIN-PD 10 can produce a favorable eye pattern (which can be used as an indicator when evaluating the high frequency characteristics of a semiconductor photoreceptor device), resulting in increased yield of the semiconductor photoreceptor device.

Further, in the PIN-PD 10, the lead-out electrode portion 18b of the p-electrode 18 runs along (111) planes from the contact electrode 18a on the p-contact layer 40 of the waveguide 16a to the electrode pad 18c on the surface of the Fe—InP substrate 24. This means that even though there is a height difference between the contact electrode 18a and the electrode pad 18c, the lead-out electrode portion 18b having a gradual slope connects between them (that is, the p-electrode 18 extends while gradually descending). This arrangement enables the flip chip mounting of the semiconductor photoreceptor device, as well as preventing the p-electrode 18 from being broken due to a sudden drop in height.

Therefore, it is possible to enhance the high frequency characteristics and the reliability of the PIN-PD 10.

Even though the above example uses Fe—InP as the semi-insulative material, Cr or Ru may be added to InP, instead of Fe.

Further, in the above example, the rear side wall surface 38b of the Fe—InP layer and the rear side wall surface 28b of the peripheral portion 282 of the n-cladding layer 28 (on which the lead-out electrode portion 18b are disposed) are (111) planes. However, they may be other than (111) planes if they are gradually sloped.

Still further, even though the lead-out electrode portion 18b is disposed on the rear side wall surface 38b of the Fe—InP layer and the rear side wall surface 28b of the peripheral portion 282 of the n-cladding layer 28 which face the light receiving surface, the present embodiment is not limited to this particular arrangement. The lead-out electrode portion 18b may be disposed on other side wall surfaces (crystal surfaces) which are (111) planes or have a gradual slope.

As described above, according to the present embodiment, a semiconductor photoreceptor device comprises: a semi-insulative semiconductor substrate; a first semiconductor layer of a first conductive type selectively disposed on the semiconductor substrate; an optical waveguide layer disposed on the first semiconductor layer and including a first cladding layer of the first conductive type, a light absorption layer, and a second cladding layer of a second conductive type which are laminated onto one another over the first semiconductor layer in that order; a semi-insulative semiconductor burying layer disposed on the first cladding layer such that sides of the optical waveguide layer are buried in the semi-insulative semiconductor burying layer; and a second electrode including: an electrode portion disposed on the second cladding layer of the optical waveguide layer; a lead-out portion extending on a side wall of the burying layer from the electrode portion and further extending on the semiconductor substrate; and an electrode pad disposed on a surface of the semiconductor substrate with an insulating film in between and connected with the lead-out portion. Thus, the lead-out portion connected to the electrode portion extends on a side wall of the burying layer and on the semiconductor substrate, and the electrode pad connected to the lead-out portion is disposed on the surface of the semi-insulative semiconductor substrate with an insulating film in between. This arrangement can reduce the capacitance between the silicon pile-up layer and the electrode pad and hence the pad capacitance of the second electrode, which is made up of the electrode portion, the lead-out portion, and the electrode pad.

Therefore, it is possible to provide a semiconductor photoreceptor device which has a simple configuration and hence achieves high yield and which exhibits good high frequency characteristics.

Further according to the present embodiment, a method for manufacturing a semiconductor photoreceptor device comprises the steps of: sequentially forming a first semiconductor layer of a first conductive type, a first cladding layer of the first conductive type, a light absorption layer, and a second cladding layer of a second conductive type over a semi-insulative semiconductor substrate, the second cladding layer being connected with a second electrode; forming an island-shaped first insulating film on the second cladding layer; to form an optical waveguide layer, removing a portion of each sequentially formed layer using said island-shaped first insulating film as a mask until the first cladding layer is removed to a predetermined depth; forming a burying layer of semi-insulative semiconductor material using the island-shaped first insulating film as a selective growth mask such that the optical waveguide layer is buried in the burying layer; after removing the island-shaped first insulating film, forming an island-shaped second insulating film on a region including the optical waveguide layer and the burying layer surrounding the optical waveguide layer; selectively removing a portion of the burying layer of the semi-insulative semiconductor material using the island-shaped second insulating film as a mask to expose the first semiconductor layer; selectively etching the exposed portion of the first semiconductor layer to expose the semiconductor substrate; forming a third insulating film on the optical waveguide layer, the burying layer, and the semiconductor substrate; and forming an electrode which includes: an electrode portion electrically connected with the second cladding layer through the third insulating film; a lead-out portion formed on a side wall of said burying layer and connected with the electrode portion, the side wall being formed along a rear surface of the optical waveguide layer, the rear surface facing a light receiving surface of the optical waveguide layer; and an electrode pad portion formed on the semiconductor substrate and connected with the lead-out portion. Thus, the lead-out portion connected to the electrode portion extends on a side wall of the burying layer and on the semiconductor substrate, and the electrode pad connected to the lead-out portion is disposed on the surface of the semi-insulative semiconductor substrate with an insulating film in between. This arrangement can prevent capacitance from being formed between the silicon pile-up layer and the electrode pad, allowing a simple manufacturing process to produce a semiconductor photoreceptor device whose second electrode (made up of an electrode portion, a lead-out portion, and an electrode pad) has a small pad capacitance.

Therefore, it is possible to provide a simple method for manufacturing a semiconductor photoreceptor device which has good high frequency characteristics and which achieves high yield.

Second Embodiment

Figure 11:
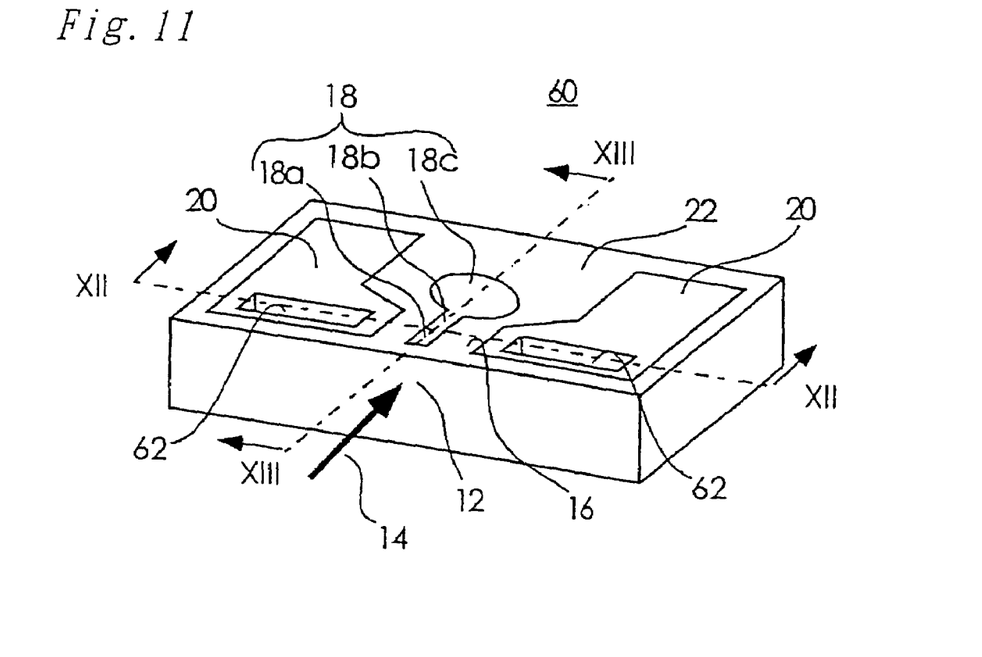
FIG. 11 is a perspective view of a semiconductor photoreceptor device according to a first embodiment of the present invention.
Figure 12:
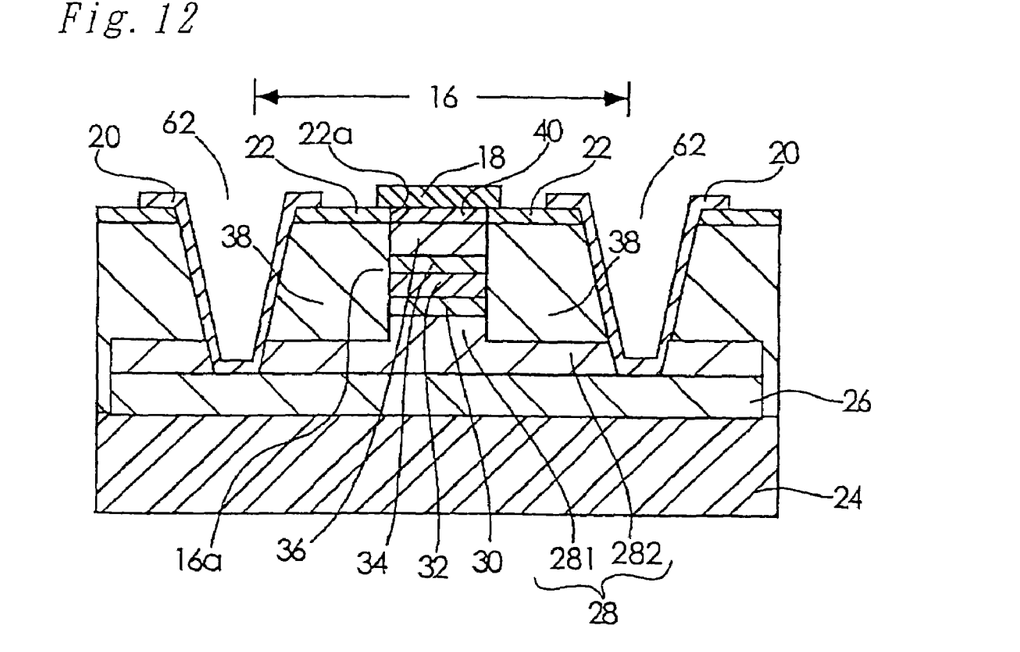
FIG. 12 is a cross-sectional view of the semiconductor photoreceptor device shown in FIG. 11 taken along line XII-XII of FIG. 11.
Figure 13:
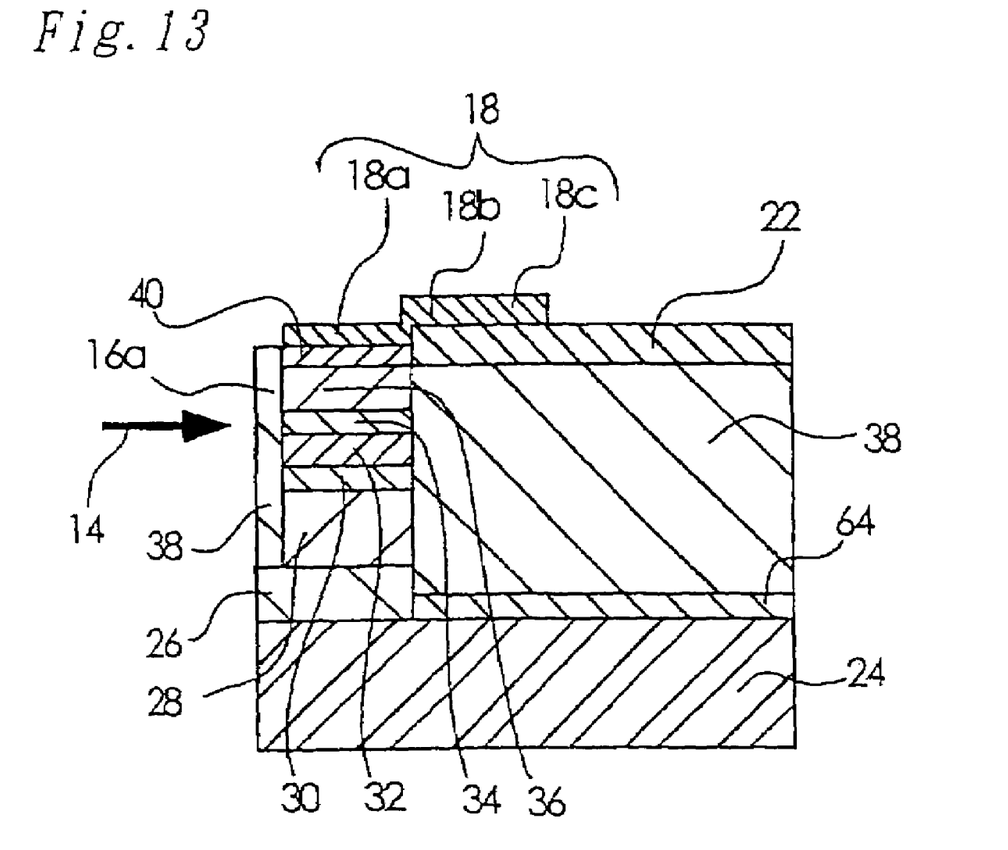
FIG. 13 is a cross-sectional view of the semiconductor photoreceptor device shown in FIG. 11 taken along line XIII-XIII of FIG. 11.

FIG. 11 is a perspective view of a semiconductor photoreceptor device according to a second embodiment of the present invention. FIG. 12 is a cross-sectional view of the semiconductor photoreceptor device shown in FIG. 11 taken along line XII-XII, while FIG. 13 is a cross-sectional view of the same semiconductor photoreceptor device taken along line XIII-XIII.

Referring to FIG. 11, a light receiving portion 12 in the front of this buried waveguide type PIN-PD 60 receives signal light 14 indicated by the arrow. On the top side of the PIN-PD 60 are disposed a waveguide 16a and a blocking layer 38 surrounding the waveguide 16a, as shown in FIGS. 12 and 13. The waveguide 16a receives the signal light through the light receiving portion 12. On both sides of the waveguide 16a are formed openings 62 that go through the blocking layer 38 and an n-cladding layer 28 to the surface of an n-contact layer 26, thus forming a waveguide mesa 16 which includes the waveguide 16a.

Each n-electrode 20 is disposed in large part on the blocking layer 38 with an SiN film 22 in between even though it is partially in contact with the n-contact layer 26 through an opening 62. Further, a p-electrode 18 is disposed on the waveguide 16a and on the blocking layer 38 with the SiN film 22 in between (the blocking layer 38 surrounding the waveguide 16a). This means that the n-electrodes 20 and the p-electrode 18 are formed at substantially the same height.

The cross section of the PIN-PD 60 shown in FIG. 12 taken along line XII-XII is not much different from the corresponding cross section of the PIN-PD 10 (shown in FIG. 2).

Specifically, as viewed in this cross section, the waveguide mesa 16 of the PIN-PD 60 is different from that of the PIN-PD 10 only in that each n-electrode 20 is partially in contact and thereby electrically connected with the n-contact layer 26 through an opening 62 and is disposed in large part on the blocking layer 38 with the SiN film 22 in between.

As viewed in the cross section shown in FIG. 13 taken along line XIII-XIII, however, the rear portion of the waveguide mesa 16 of the PIN-PD 60 is different from that of the PIN-PD 10 (shown in FIG. 3).

Specifically, in the PIN-PD 10, the portion of the block layer 38 located behind the waveguide 16a and facing the light receiving surface 12 has been removed to expose the Fe—InP substrate 24. In the case of PIN-PD 60, on the other hand, a Zn—InP layer 64 (a semiconductor layer containing a p-type impurity) is disposed on the Fe—InP substrate 24 behind the waveguide 16a, and the blocking layer 38 is disposed on the Zn—InP layer 64, as shown in FIG. 13.

If the blocking layer 38 is directly regrown on the Fe—InP substrate 24, the Si pile-up layer formed at the interface between the Fe—InP substrate 24 and the blocking layer 38 becomes conductive. To prevent this from happening, the PIN-PD 60 includes the Zn—InP layer 64 formed on the Fe—InP substrate 24. The Zn—InP layer 64 contains a Zn concentration just high enough to compensate for the Si concentration (e.g., a peak value of approximately $1 \times 10^{18}$ atoms/cc) of the Si pile-up layer forming at the interface.

It should be noted that even though this example uses Zn as the p-type impurity, the present embodiment is not limited to this particular type of impurity. A Group II element or Group IV element including Be, Mg, or C may be used.

In the PIN-PD 60, the p-electrode 18 is made up of: a contact electrode 18a disposed on a p-contact layer 40 of the waveguide 16a through an opening 22a in the SiN film 22; a lead-out electrode portion 18b connected to the contact electrode 18a and disposed on the top surface of the blocking layer 38 with the SiN film 22 in between; and an electrode pad 18c connected to the lead-out electrode portion 18b and disposed on the top surface of the blocking layer 38 with the SiN film 22 in between.

A brief description will be given below of a method for manufacturing the PIN-PD 60 according to the second embodiment.

First of all, over the semi-insulative Fe—InP substrate 24 are disposed an n-InGaAs layer (corresponding to the n-contact layer 26), an n-InP layer (the n-cladding layer 28), an n-InGaAsP layer (the n-light confining layer 30), i-InGaAs (the light absorption layer 32), p-InGaAsP (the p-light confining layer 34), a p-InP layer (the p-cladding layer 36), and a p-InGaAs layer (the p-contact layer 40) which are formed to a predetermined thickness and laminated onto one another in that order by a vapor phase growth method such as the MOCVD method.

Then, an $SiO_2$ film is formed on the surface of the p-InGaAs layer (corresponding to the p-contact layer 40) at the top of the layer stack as a first insulating film and processed to form a rectangular $SiO_2$ film 50 as an island-shaped first insulating film. (The rectangular $SiO_2$ film 50 corresponds to the top surface of the waveguide 16a to be formed.) The waveguide 16a is formed using this rectangular $SiO_2$ film as a mask. This waveguide forming process is performed in stages such that: the etching of the portions in front and to the sides of the waveguide 16a is stopped when the n-InP layer (the n-cladding layer 28) has been completely exposed; and the etching of the portion behind the waveguide 16a is performed until the Fe—InP substrate 24 is exposed.

Then, the Zn—InP layer 64 is formed on surface of the Fe—InP substrate 24 using the rectangular $SiO_2$ film as a selective growth mask. The Zn—InP layer 64 contains a Zn concentration just high enough to compensate for the Si concentration (e.g., a peak value of approximately $1 \times 10^{18}$ atoms/cc) of the Si pile-up layer forming on the Fe—InP substrate 24.

Furthermore, Fe—InP is selectively grown such that the waveguide 16a is buried in an Fe—InP layer acting as a burying layer.

Then, after removing the rectangular $SiO_2$ film, an SiN film is formed on the surfaces of the waveguide 16a and the Fe—InP layer as a second insulating film. Furthermore, the opening 22a is formed so as to expose the p-contact layer 40, and the openings 62 are formed so as to expose the portions of the n-contact layer 26 on both sides of the waveguide mesa 16. After that, EB evaporation is carried out using a photoresist as a lift-off mask and then a lift-off etching process is performed to form the p-electrode 18 and the n-electrodes 20.

In the PIN-PD 60 formed as described above, Zn diffuses into the Si pile-up layer formed at the regrowth interface, reducing the carrier concentration of the Si pile-up layer. This increases the resistance value of the Si pile-up layer, resulting in loss of conductivity. This means that no capacitance occurs between the Si pile-up layer and the lead-out electrode portion 18b and the electrode pad 18c disposed on the SiN film 22 formed on the top surface of the blocking layer 38.

Therefore, the entire p-electrode 18 has reduced pad capacitance, making it possible to provide a semiconductor photoreceptor device having good high frequency characteristics.

Further, there are no sudden drops in height between the p-electrode 18 and the n-electrodes 20, enabling flip-chip mounting and enhancing the high frequency characteristics and the reliability of the PIN-PD 60.

According to the above method for manufacturing the PIN-PD of the present embodiment, the Zn—InP layer 64 is formed on the surface of the Fe—InP substrate 24 simply using the rectangular $SiO_2$ film as a selective growth mask before selectively growing Fe—InP by the metalorganic (chemical) vapor deposition method such that the waveguide 16a is buried in an Fe—InP layer (acting as a burying layer). This Zn—InP layer 64 forming process may be replaced by the following process in order to produce a PIN-PD having no Si pile-up layer. First, the temperature of the wafer is increased within a $PH_3$ atmosphere. When the Fe—InP growth temperature has been reached, a small amount of HCL is introduced into the $PH_3$ atmosphere so as to etch the Si pile-up layer. After that, the Fe—InP layer acting as the burying layer is grown using the rectangular $SiO_2$ film as a selective growth mask without exposing the wafer to an air ambient.

The PIN-PD formed through this manufacturing process has no conductive Si pile-up layer, eliminating the problem of capacitance forming between an Si pile-up layer and the lead-out electrode portion 18b and the electrode pad 18c disposed on the SiN film 22 formed on the top surface of the blocking layer 38. Therefore, the entire p-electrode 18 has reduced pad capacitance, making it possible to provide a semiconductor photoreceptor device having good high frequency characteristics.

As described above, according to the present embodiment, a semiconductor photoreceptor device comprises: a semi-insulative semiconductor substrate; an optical waveguide layer disposed on the semiconductor substrate and including a first cladding layer of a first conductive type, a light absorption layer, and a second cladding layer of a second conductive type which are laminated onto one another over the semiconductor substrate in that order; a p-type impurity semiconductor layer disposed on the semiconductor substrate such that the p-type impurity semiconductor layer is close to the portion of the semiconductor substrate surrounding the optical waveguide layer, the p-type impurity semiconductor layer containing a predetermined concentration of a p-type impurity; a semi-insulative semiconductor burying layer disposed on the semiconductor substrate with the p-type impurity semiconductor layer in between such that sides of the optical waveguide layer are buried in the semi-insulative semiconductor burying layer; and a second electrode including: a lead-out portion and an electrode pad both disposed on an insulating film formed on a surface of the burying layer, the lead-out portion and the electrode pad facing the p-type impurity semiconductor layer; and an electrode portion disposed on the second cladding layer of the optical waveguide layer.

The above arrangement allows the p-type impurity to diffuse into the Si pile-up layer, reducing the carrier concentration of the Si pile-up layer. This increases the resistance value of the Si pile-up layer, resulting in loss of conductivity. This means that no capacitance occurs between the Si pile-up layer and the lead-out portion and the electrode pad of the second electrode.

Therefore, the entire second electrode has reduced pad capacitance, allowing the semiconductor photoreceptor device to have good high frequency characteristics.

Accordingly, it is possible to provide a semiconductor photoreceptor device which has a simple configuration and hence achieves high yield and which exhibits good high frequency characteristics.

Further according to the present embodiment, a method for manufacturing a semiconductor photoreceptor device comprises the steps of: sequentially forming a first cladding layer of a first conductive type, a light absorption layer, and a second cladding layer of a second conductive type over a semi-insulative semiconductor substrate; forming an island-shaped first insulating film on the second cladding layer; to form an optical waveguide layer, removing a portion of each sequentially formed layer using the island-shaped first insulating film as a mask until the semiconductor substrate is exposed; forming a p-type impurity semiconductor layer using the island-shaped first insulating film as a selective growth mask, the p-type impurity semiconductor layer containing a predetermined concentration of a p-type impurity; after forming the p-type impurity semiconductor layer, forming a burying layer of semi-insulative semiconductor material using the island-shaped first insulating film as a selective growth mask such that the optical waveguide layer is buried in the burying layer; after removing the island-shaped first insulating film, forming a second insulating film; and forming a second electrode which includes: an electrode portion electrically connected with the second cladding layer; and a lead-out portion and an electrode pad both disposed on the second insulating film formed on a surface of the burying layer, the lead-out portion and the electrode pad being connected with the electrode portion and facing the p-type impurity semiconductor layer.

The above arrangement allows the p-type impurity to diffuse into the Si pile-up layer, reducing the carrier concentration of the Si pile-up layer. This increases the resistance value of the Si pile-up layer, resulting in loss of conductivity. This means that no capacitance occurs between the Si pile-up layer and the lead-out portion and the electrode pad of the second electrode. Therefore, the entire second electrode has reduced pad capacitance, allowing a simple process to produce a semiconductor photoreceptor device having good high frequency characteristics.

Accordingly, it is possible to provide a simple method for manufacturing a semiconductor photoreceptor device which has good high frequency characteristics and which achieves high yield.

Still further according to the present embodiment, another method for manufacturing a semiconductor photoreceptor device comprises the steps of: sequentially forming a first cladding layer of a first conductive type, a light absorption layer, and a second cladding layer of a second conductive type over a semi-insulative semiconductor substrate; forming an island-shaped first insulating film on the second cladding layer; to form an optical waveguide layer, removing a portion of each sequentially formed layer using the island-shaped first insulating film as a mask until the semiconductor substrate is exposed; removing a silicon pile-up layer using the island-shaped first insulating film as a mask; and without exposing the wafer to an air ambient, forming a burying layer of semi-insulative semiconductor material using the island-shaped first insulating film as a selective growth mask such that the optical waveguide layer is buried in the burying layer.

Thus, the above method removes the Si pile-up layer, eliminating the problem of capacitance being formed due to the Si pile-up layer. Therefore, the entire p-electrode 18 has reduced pad capacitance, allowing a simple manufacturing process to produce a semiconductor photoreceptor device having good high frequency characteristics.

Accordingly, it is possible to provide a simple method for manufacturing a semiconductor photoreceptor device which has good high frequency characteristics and which achieves high yield.

Thus, the semiconductor photoreceptor devices of the present invention are useful as optical communications devices for optical communications systems.

The features and advantages of the present invention may be summarized as follows.

In the semiconductor photoreceptor device of the present invention described above, the lead-out portion connected to the electrode portion extends on a side wall of the burying layer and on the semiconductor substrate, and the electrode pad connected to the lead-out portion is disposed on the surface of the semi-insulative semiconductor substrate with an insulating film in between. This can reduce the capacitance between the silicon pile-up layer and the electrode pad and hence the pad capacitance of the second electrode made up of the electrode portion, the lead-out portion, and the electrode pad.

Obviously many modifications and variations of the present invention are possible in the light of the above teachings. It is therefore to be understood that within the scope of the appended claims the invention may be practiced otherwise than as specifically described.

The entire disclosure of Japanese Patent Applications No. 2004-244823, filed on Aug. 25, 2004 including specification, claims, drawings and summary, on which the Convention priority of the present application is based, are incorporated herein by reference in their entirety.

What is claimed is:

1. A semiconductor photoreceptor device comprising:
   a semi-insulating semiconductor substrate;
   a first semiconductor layer of a first conductive type disposed on said semiconductor substrate and having a first electrode disposed thereon;
   an optical waveguide layer disposed on said first semiconductor layer and including a first cladding layer of the first conductive type, a light absorption layer, and a second cladding layer of a second conductive type, laminated on one another, over said first semiconductor layer, in that order;
   a semi-insulating semiconductor burying layer disposed on said first cladding layer such that sides of said optical waveguide layer are buried in said semi-insulating semiconductor burying layer; and
   a second electrode including:
      an electrode portion disposed on said second cladding layer of said optical waveguide layer;
      a lead-out portion extending on a side wall of said semi-insulating semiconductor burying layer from said electrode portion and extending on said semiconductor substrate wherein
      said side wall of said semi-insulating semiconductor burying layer is located along a rear surface of said optical waveguide layer and is a (111) plane of said semi-insulating semiconductor burying layer, and
      the rear surface faces a light incident surface of said optical waveguide layer; and
      an electrode pad disposed on a surface of said semiconductor substrate, with an insulating film between said electrode pad and said semiconductor substrate, said electrode pad being connected to said lead-out portion.

2. The semiconductor photoreceptor device according to claim 1, wherein said semi-insulating semiconductor burying layer is InP containing a dopant impurity selected from the group consisting of Fe, Cr, and Ru.

* * * * *

UNITED STATES PATENT AND TRADEMARK OFFICE
CERTIFICATE OF CORRECTION

PATENT NO. : 7,557,418 B2  Page 1 of 2
APPLICATION NO. : 11/133338
DATED : July 7, 2009
INVENTOR(S) : Nakaji et al.

It is certified that error appears in the above-identified patent and that said Letters Patent is hereby corrected as shown below:

Col. 16, line 10, claim 1 should read as follows.

1. A semiconductor photoreceptor device comprising:

a semi-insulating semiconductor substrate;

a first semiconductor layer of a first ~~conductive~~ conductivity type disposed on said semiconductor substrate and having a first electrode disposed thereon;

an optical waveguide layer disposed on said first semiconductor layer and including a first cladding layer of the first ~~conductive~~ conductivity type, a light absorption layer, and a second cladding layer of a second ~~conductive~~ conductivity type, laminated on one another, over said first semiconductor layer, in that order;

a semi-insulating semiconductor burying layer disposed on said first cladding layer such that sides of said optical waveguide layer are buried in said semi-insulating semiconductor burying layer; and a second electrode including:

an electrode portion disposed on said second cladding layer of said optical waveguide layer;

a lead-out portion extending on a side wall of said semi-insulating

Signed and Sealed this

Thirty-first Day of August, 2010

David J. Kappos
*Director of the United States Patent and Trademark Office* semiconductor burying layer from said electrode portion and extending on said semiconductor substrate wherein said side wall of said semi-insulating semiconductor burying layer is located along a rear surface of said optical waveguide layer and is a (111) plane of said semi-insulating semiconductor burying layer, and the rear surface faces a light incident surface of said optical waveguide layer; and an electrode pad disposed on a surface of said semiconductor substrate, with an insulating film between said electrode pad and said semiconductor substrate, said electrode pad being connected to said lead-out portion.